US010741357B2

United States Patent
Inoue et al.

(10) Patent No.: US 10,741,357 B2
(45) Date of Patent: Aug. 11, 2020

(54) METHOD OF OBSERVING LIQUID SPECIMEN, METHOD OF ANALYZING LIQUID SPECIMEN AND ELECTRON MICROSCOPE

(71) Applicant: JEOL Ltd., Tokyo (JP)

(72) Inventors: Noriyuki Inoue, Tokyo (JP); Toshiaki Suzuki, Tokyo (JP); Yoshiko Takashima, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 16/362,924

(22) Filed: Mar. 25, 2019

(65) Prior Publication Data
US 2019/0295813 A1    Sep. 26, 2019

(30) Foreign Application Priority Data
Mar. 26, 2018    (JP) .................... 2018-058369

(51) Int. Cl.
*H01J 37/20*    (2006.01)
*H01J 37/28*    (2006.01)

(52) U.S. Cl.
CPC .............. *H01J 37/20* (2013.01); *H01J 37/28* (2013.01); *H01J 2237/204* (2013.01); *H01J 2237/2007* (2013.01); *H01J 2237/2065* (2013.01)

(58) Field of Classification Search
CPC .............. H01J 37/20; H01J 2237/2004; H01J 2237/2608; H01J 2237/2003; H01J 37/16; H01J 2237/1825; H01J 2237/20; H01J 2237/28; H01J 37/18; G01N 2223/418; G01N 23/2204

USPC ...... 250/440.11, 307, 310, 311, 442.11, 306, 250/309
See application file for complete search history.

(56) References Cited

U.S. PATENT DOCUMENTS

| | | | | |
|---|---|---|---|---|
| 7,745,802 B2 * | 6/2010 | Nishiyama | .............. | H01J 37/20 250/306 |
| 7,906,760 B2 * | 3/2011 | Nishiyama | ......... | G01N 23/2202 250/307 |
| 8,059,271 B2 * | 11/2011 | Marsh | .................... | G02B 21/34 250/440.11 |
| 8,555,710 B2 * | 10/2013 | Yu | ...................... | G01N 23/2204 250/440.11 |
| 9,508,527 B2 * | 11/2016 | Ominami | ................ | H01J 37/16 |
| 10,134,564 B2 * | 11/2018 | Okumura | ................ | H01J 37/20 |
| 10,431,416 B2 * | 10/2019 | Ominami | ................ | H01J 37/16 |
| 2017/0154753 A1 | 6/2017 | Inoue et al. | | |

FOREIGN PATENT DOCUMENTS

JP            201627552 A      2/2016

* cited by examiner

*Primary Examiner* — David A Vanore
(74) *Attorney, Agent, or Firm* — The Webb Law Firm

(57) ABSTRACT

A method of observing a liquid specimen in an electron microscope includes: housing the liquid specimen in a space formed by a specimen stage and a lid member; and observing the liquid specimen, wherein the lid member includes a water retaining material, and a supporting member for supporting the water retaining material, and the water retaining material is provided with a through-hole that enables passage of an electron beam with which the liquid specimen is irradiated.

20 Claims, 9 Drawing Sheets

METHOD OF OBSERVING LIQUID SPECIMEN, METHOD OF ANALYZING LIQUID SPECIMEN AND ELECTRON MICROSCOPE

CROSS-REFERENCE TO RELATED APPLICATION

This application claims priority to Japanese Patent Application No. 2018-058369 filed Mar. 26, 2018, the disclosure of which is hereby incorporated by reference in its entirety.

BACKGROUND OF THE INVENTION

Field of the Invention

The present invention relates to a method of observing a liquid specimen, a method of analyzing a liquid specimen and an electron microscope.

Description of Related Art

With a scanning electron microscope (SEM), when a water-containing specimen is introduced into a specimen chamber without alteration to observe or analyze the water-containing specimen, water may be evaporated and the water-containing specimen may be dehydrated during a process of evacuation before observation conditions are satisfied. In addition, heat of vaporization generated by the evaporation of water in the specimen may lower specimen temperature and, in some cases, cause the specimen to freeze.

Therefore, for example, in JP-A-2016-027552, a specimen is observed or analyzed by introducing the specimen into a specimen chamber of a scanning electron microscope in a state where the specimen is covered by a water retaining material and, after evacuating the specimen chamber, exposing the specimen by relatively moving the water retaining material and the specimen.

However, with the method disclosed in JP-A-2016-027552, since exposing the specimen requires that the water retaining material and the specimen be relatively moved after evacuating the specimen chamber, the method consumes time and effort.

SUMMARY OF THE INVENTION

The invention can provide a method that enables a liquid specimen to be readily observed, a method that enables a liquid specimen to be readily analyzed and an electron microscope.

According to a first aspect of the invention, there is provided a method of observing a liquid specimen in an electron microscope, the method including:
  housing the liquid specimen in a space formed by a specimen mount and a lid member; and
  observing the liquid specimen,
  the lid member including a water retaining material and a supporting member for supporting the water retaining material, and
  the lid member being provided with a through-hole that enables passage of an electron beam with which the liquid specimen is irradiated.

According to a second aspect of the invention, there is provided a method of analyzing a liquid specimen in an electron microscope, the method including:
  housing the liquid specimen in a space formed by a specimen mount and a lid member; and
  analyzing the liquid specimen,
  the lid member including a water retaining material and a supporting member for supporting the water retaining material, and
  the lid member being provided with a through-hole that enables passage of an electron beam with which the liquid specimen is irradiated.

According to a third aspect of the invention, there is provided an electron microscope for observing or analyzing a liquid specimen, the electron microscope including:
  a specimen mount; and
  a supporting member for supporting a water retaining material,
  a lid member being composed of the supporting member and the water retaining material supported by the supporting member,
  the liquid specimen being housed in a space formed by the lid member and the specimen mount, and
  the lid member being provided with a through-hole that enables passage of an electron beam with which the liquid specimen is irradiated.

DESCRIPTION OF THE INVENTION

Figure 1:
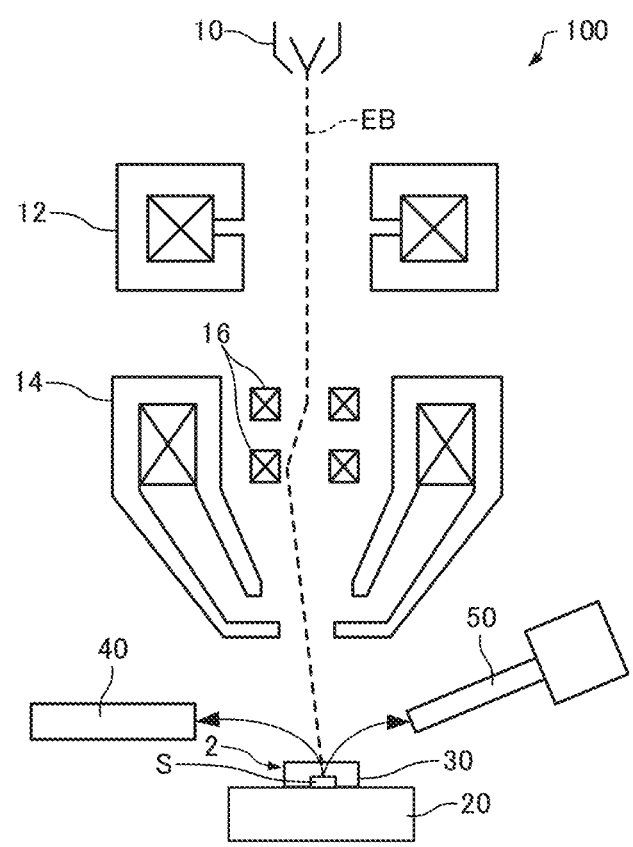
FIG. 1 is a diagram illustrating a configuration of an electron microscope according to an embodiment of the invention.

According to an embodiment of the invention, there is provided a method of observing a liquid specimen in an electron microscope, the method including:
  housing the liquid specimen in a space formed by a specimen mount and a lid member; and
  observing the liquid specimen, the lid member including a water retaining material and a supporting member for supporting the water retaining material, and the lid member being provided with a through-hole that enables passage of an electron beam with which the liquid specimen is irradiated.

With such a method, a liquid specimen can be observed in an electron microscope while reducing evaporation of water in the liquid specimen and preventing the liquid specimen from dehydration and freezing. In addition, with such a method, the liquid specimen can be observed in a state where the liquid specimen is housed in the space formed by the specimen mount and the lid member. Therefore, with such a method, the liquid specimen can be readily observed without the hassle of, for example, removing the lid member.

According to an embodiment of the invention, there is provided a method of analyzing a liquid specimen in an electron microscope, the method including:

housing the liquid specimen in a space formed by a specimen mount and a lid member; and analyzing the liquid specimen, the lid member including a water retaining material and a supporting member for supporting the water retaining material, and the lid member being provided with a through-hole that enables passage of an electron beam with which the liquid specimen is irradiated.

With such a method, a liquid specimen can be analyzed in an electron microscope while reducing evaporation of water in the liquid specimen and preventing the liquid specimen from dehydration and freezing. In addition, with such a method, the liquid specimen can be analyzed in a state where the liquid specimen is housed in the space formed by the specimen mount and the lid member. Therefore, with such a method, the liquid specimen can be readily analyzed without the hassle of, for example, removing the lid member.

According to an embodiment of the invention, there is provided an electron microscope for observing or analyzing a liquid specimen, the electron microscope including:

a specimen mount; and a supporting member for supporting a water retaining material, a lid member being composed of the supporting member and the water retaining material supported by the supporting member, the liquid specimen being housed in a space formed by the lid member and the specimen mount, and the lid member being provided with a through-hole that enables passage of an electron beam with which the liquid specimen is irradiated.

With such an electron microscope, a liquid specimen can be observed or analyzed while reducing evaporation of water in the liquid specimen and preventing the liquid specimen from dehydration and freezing. In addition, with such an electron microscope, the liquid specimen can be observed or analyzed in a state where the liquid specimen is housed in the space formed by the specimen mount and the lid member. Therefore, with such an electron microscope, the liquid specimen can be readily observed or analyzed.

Embodiments of the invention are described in detail below with reference to the drawings. Note that the following embodiments do not unduly limit the scope of the invention as stated in the claims. In addition, all of the elements described in connection with the following embodiments should not necessarily be taken as essential requirements of the invention.

1. Electron Microscope

First, an electron microscope according to a first embodiment will be described with reference to the drawings. FIG. 1 is a diagram illustrating a configuration of an electron microscope 100 according to the first embodiment.

The electron microscope 100 is a scanning electron microscope for observing a liquid specimen S. The liquid specimen S is a specimen that contains a liquid. While a typical example of such a liquid is water, liquids other than water may be used instead. Specifically, examples of the liquid specimen S include a water droplet, water on a surface of a substance, water or a liquid other than water itself, and a specimen containing water or a liquid other than water. In addition, examples of the liquid specimen S include organisms, plants, food items, and cosmetic items. Specific examples of such a liquid specimen S include seaweed such as kelp, konnyaku (konjac), agar, water absorptive polymer, a contact lens, and lipids.

As illustrated in FIG. 1, the electron microscope 100 includes an electron source 10, a condenser lens 12, an objective lens 14, a deflector 16, a specimen stage 20, a supporting member 30 constituting a lid member 2, an electron detector 40, and an EDS detector 50.

The electron source 10 generates electrons. The electron source 10 is, for example, an electron gun which accelerates electrons emitted from a cathode by an anode and which emits an electron beam EB.

The condenser lens 12 causes the electron beam EB emitted from the electron source 10 to converge to form an electron probe. A diameter and a probe current (an irradiating current amount) of the electron probe can be controlled by the condenser lens 12.

The objective lens 14 is a lens for forming an electron probe arranged immediately before the liquid specimen S. For example, the objective lens 14 is configured so as to include a coil and a yoke. In the objective lens 14, magnetic lines created by the coil are encased in the yoke made of a material with high magnetic permeability such as iron, and the densely distributed magnetic lines are leaked onto an optical axis by creating a notch (a lens cap) in a part of the yoke.

The deflector 16 deflects the electron probe (the converged electron beam EB) formed by the condenser lens 12 and the objective lens 14. The deflector 16 is used in order to scan a surface of the liquid specimen S with the electron probe. The deflector 16 is driven based on a scanning signal generated by a scanning signal generator (not illustrated) and deflects the electron beam EB. As a result, the surface of the liquid specimen S can be scanned with the electron probe.

The liquid specimen S is placed on the specimen stage 20. The specimen stage 20 supports the liquid specimen S. The specimen stage 20 is equipped with a moving mechanism and is capable of moving the liquid specimen S. In addition, the specimen stage 20 is equipped with a cooling mechanism and is capable of cooling the liquid specimen S. In the specimen stage 20, for example, cooling may be performed by circulating a cooled fluid or by using a Peltier element or the like.

A specimen chamber in which the specimen stage 20 is arranged is maintained at predetermined pressure by being evacuated by an evacuation device (not illustrated). The electron microscope 100 is capable of performing an observation or an analysis when a degree of vacuum of the specimen chamber is, for example, around several ten Pa to several hundred Pa. In other words, the electron microscope 100 is a so-called low-vacuum SEM.

Figure 2:
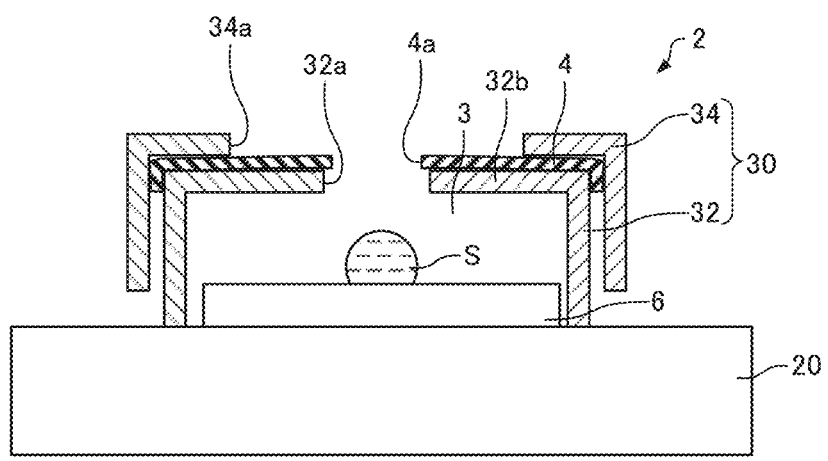
FIG. 2 is a sectional view schematically illustrating a lid member of an electron microscope according to an embodiment of the invention.
Figure 3:
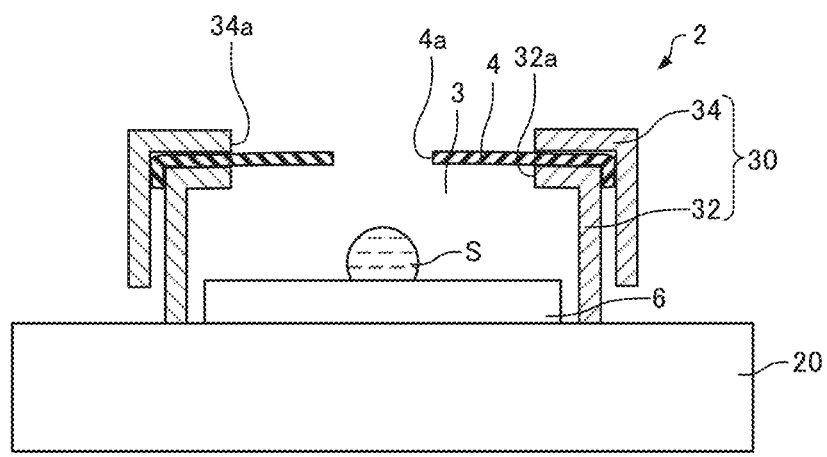
FIG. 3 is a sectional view schematically illustrating a lid member of an electron microscope according to an embodiment of the invention.
Figure 4:
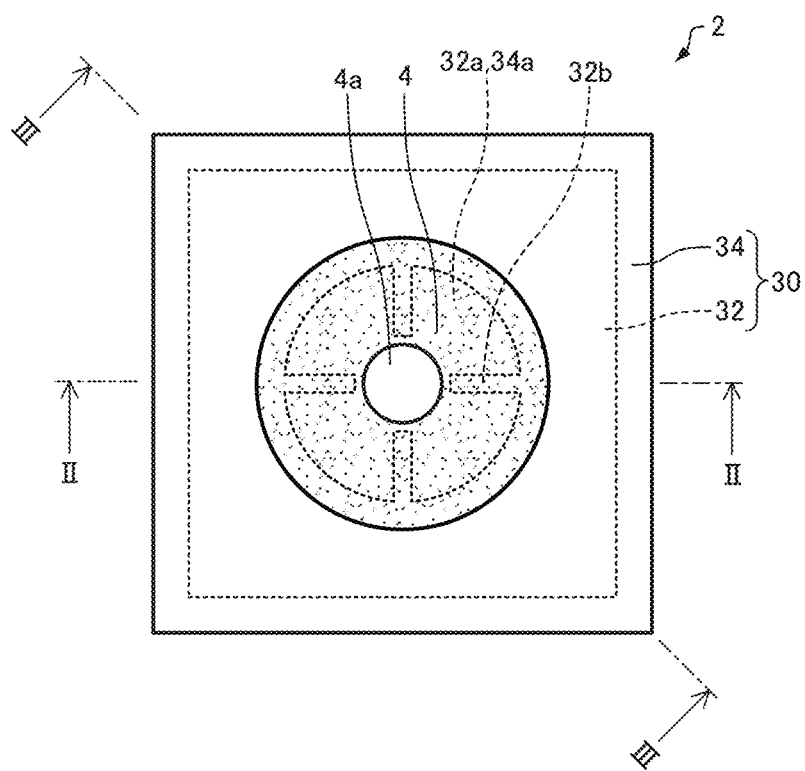
FIG. 4 is a plan view schematically illustrating a lid member of an electron microscope according to an embodiment of the invention.

The supporting member 30 supports a water retaining material 4 as illustrated in FIGS. 2 to 4 to be described later. The supporting member 30 and the water retaining material 4 constitute the lid member 2. In the electron microscope 100, the liquid specimen S is housed in a space formed by the specimen stage 20 and the lid member 2. Details of the lid member 2 will be described later.

The electron detector 40 detects electrons emitted from the liquid specimen S when the liquid specimen S is irradiated with the electron beam EB (the electron probe). The electron detector 40 may be a secondary electron detector that detects secondary electrons emitted from the liquid specimen S or a backscattered electron detector that detects backscattered electrons emitted from the liquid specimen S. An SEM image (a secondary electron image or a backscattered electron image) can be obtained by detecting electrons emitted from the liquid specimen S by the electron detector 40.

In the electron microscope 100, electrons emitted from the liquid specimen S may be detected by using gas amplification. Gas amplification refers to an amplification effect produced by repetition of a phenomenon in which, when an electric field is applied to a gas atmosphere kept at given pressure, electrons are accelerated by the electric field and collide with gas molecules to ionize the gas molecules.

The EDS detector 50 detects characteristic X-rays generated from the liquid specimen S when the liquid specimen S is irradiated with the electron beam EB. The EDS detector 50 is, for example, a silicon-drift detector (SDD). An EDS spectrum can be obtained by detecting characteristic X-rays with the EDS detector 50.

FIGS. 2 and 3 are sectional views schematically illustrating the lid member 2. FIG. 4 is a plan view schematically illustrating the lid member 2. Note that FIG. 2 is a sectional view taken along line II-II in FIG. 4 and FIG. 3 is a sectional view taken along line III-III in FIG. 4.

In the electron microscope 100, the liquid specimen S is housed in a space 3 formed by the specimen stage 20 and the lid member 2. In the example illustrated in FIGS. 2 and 3, the liquid specimen S is arranged on a substrate 6 and arranged inside the space 3 together with the substrate 6.

As illustrated in FIGS. 2 to 4, the lid member 2 includes the water retaining material 4 and the supporting member 30 which supports the water retaining material 4.

The water retaining material 4 retains water. The water retaining material 4 is obtained by causing paper (for example, Kimwipes (registered trademark)), cloth, non-woven fabric, sponge, or a water absorptive polymer to contain water. For example, a piece of paper soaked in water can be used as the water retaining material 4.

The water retaining material 4 is held by the supporting member 30. The lid member 2 is configured by having the supporting member 30 hold the water retaining material 4. The water retaining material 4 defines a part of the space 3. Water vapor created by vaporization of water in the water retaining material 4 is supplied into the space 3. Since water vapor is supplied from the water retaining material 4 to the space 3 formed by the specimen stage 20 and the lid member 2, evaporation of water in the liquid specimen S that is housed in the space 3 can be reduced.

The water retaining material 4 has a through-hole 4a for allowing passage of the electron beam EB. The through-hole 4a communicates the inside and the outside of the space 3 with each other. The electron beam EB passes through the through-hole 4a and the liquid specimen S is irradiated with the electron beam EB. In addition, the electrons (secondary electrons and backscattered electrons) or X-rays (characteristic X-rays) emitted from the liquid specimen S when the liquid specimen S is irradiated with the electron beam EB pass through the through-hole 4a to be detected by the electron detector 40 and the EDS detector 50.

The supporting member 30 is configured so as to be capable of supporting the water retaining material 4. In the example illustrated in FIGS. 2 and 3, the supporting member 30 has a first portion 32 and a second portion 34. The water retaining material 4 can be supported by being sandwiched between the first portion 32 and the second portion 34.

The first portion 32 has a recessed portion to constitute the space 3. A through-hole 32a is formed in the first portion 32. The water retaining material 4 is arranged so as to block a part of the through-hole 32a. The first portion 32 has a plurality of beam portions 32b extending toward a center of the through-hole 32a. The plurality of beam portions 32b support the water retaining material 4 so as to prevent the water retaining material 4 from falling.

The second portion 34 is arranged above the first portion 32. The second portion 34 is arranged on top of the water retaining material 4 arranged on top of the first portion 32. The second portion 34 has a through-hole 34a. The through-hole 34a overlaps with the through-hole 32a.

An upper part of the space 3 is defined by the water retaining material 4 and the water retaining material 4 is positioned above the liquid specimen S housed in the space 3. The liquid specimen S is arranged so as to overlap with the through-hole 4a of the water retaining material 4 as viewed from an incidence direction of the electron beam EB.

While a case where the specimen stage 20 functions as a specimen mount which forms the space 3 together with the lid member 2 has been described above, a specimen mount (a specimen holder or the like) on which the liquid specimen S is to be arranged may be prepared separately from the specimen stage 20 and the space 3 may be formed by the specimen mount and the lid member 2.

2. Method of Observing or Analyzing Liquid Specimen

Next, a method of observing or analyzing the liquid specimen S according to a second embodiment (hereinafter, also simply referred to as a "method according to the second embodiment") will be described. In this case, an example of observing or analyzing a water droplet as the liquid specimen S by using the electron microscope 100 will be described.

In the electron microscope 100, as illustrated in FIGS. 2 and 3, the liquid specimen S is housed in the space 3 formed by the specimen stage 20 and the lid member 2.

Specifically, first, the water retaining material 4 is prepared. For example, when the water retaining material 4 is a piece of paper (for example, Kimwipes), the piece of paper is soaked in water to create a state where the water retaining material 4 retains water. Next, the through-hole 4a is formed in the water retaining material 4. The formation of the through-hole 4a may be performed in a state where the water retaining material 4 is being supported by the supporting member 30.

Next, the water retaining material 4 is attached to the supporting member 30 to form the lid member 2. Specifically, the water retaining material 4 is sandwiched between the first portion 32 and the second portion 34 of the supporting member 30 to fix the water retaining material 4.

Next, a water droplet as the liquid specimen S is formed on the substrate 6 arranged on the specimen stage 20. In addition, the lid member 2 is arranged on the specimen stage 20 and the liquid specimen S is housed in the space 3 formed by the specimen stage 20 and the lid member 2.

Next, the specimen chamber is evacuated and placed in a vacuum state. Even when the specimen chamber is evacuated, since the liquid specimen S is housed in the space 3 formed by the specimen stage 20 and the lid member 2, evaporation of water in the liquid specimen S can be reduced. In addition, at this point, the liquid specimen S is cooled by the specimen stage 20 so as to enable the liquid specimen S to exist in a liquid state.

Next, the liquid specimen S is irradiated with the electron beam EB and the liquid specimen S is observed or analyzed. The observation or analysis of the liquid specimen S is performed in a state where the liquid specimen S is housed in the space 3. Specifically, when performing an observation (an SEM observation) of the liquid specimen S, the electron beam EB passes through the through-hole 4a of the water retaining material 4, the liquid specimen S is irradiated with the electron beam EB, and electrons emitted from the liquid specimen S pass through the through-hole 4a and are detected by the electron detector 40. In addition, when performing an analysis (an EDS analysis) of the liquid specimen S, the electron beam EB passes through the through-hole 4a of the water retaining material 4, the liquid specimen S is irradiated with the electron beam EB, and characteristic X-rays generated by the liquid specimen S pass through the through-hole 4a and are detected by the EDS detector 50.

With the method according to the second embodiment, since the liquid specimen S is housed in the space 3 even when an observation or an analysis of the liquid specimen S is being performed, evaporation of water in the liquid specimen S can be reduced.

The liquid specimen S can be observed or analyzed according to the steps described above.

Figure 5:
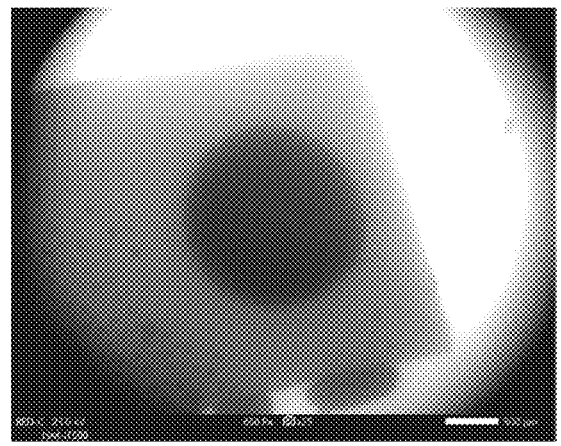
FIG. 5 is an SEM image illustrating a result of observing a water droplet by a method according to an embodiment of the invention.
Figure 6:
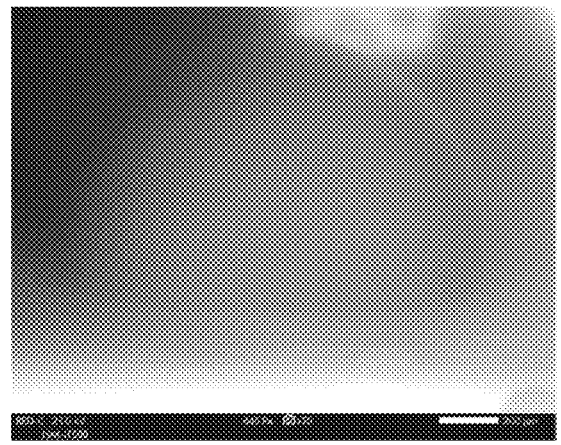
FIG. 6 is an SEM image illustrating a result of observing a water droplet by a method according to an embodiment of the invention.

FIGS. 5 and 6 are SEM images illustrating a result of observing a water droplet by the method according to the second embodiment. Note that FIG. 5 represents a case where a water droplet is dropped onto a horizontal specimen mount while FIG. 6 represents a case where a water droplet is dropped onto a specimen mount tilted by 90 degrees.

In the SEM image illustrated in FIG. 5, a bright portion corresponds to the through-hole 4a of the water retaining material 4 and a dark circular central portion corresponds to the water droplet. In the SEM image illustrated in FIG. 6, a hemispherical water droplet is observed. As illustrated in FIGS. 5 and 6, a water droplet can be clearly observed with the method according to the second embodiment.

3. Features

For example, the method according to the second embodiment has the following features.

With the method according to the second embodiment, the liquid specimen S is observed or analyzed by housing the liquid specimen S in the space 3 formed by the specimen stage 20 and the lid member 2. In addition, the lid member 2 includes the water retaining material 4 and the supporting member 30 which supports the water retaining material 4, and the water retaining material 4 is provided with the through-hole 4a which enables passage of the electron beam EB with which the liquid specimen S is irradiated.

Therefore, with the method according to the second embodiment, the liquid specimen S can be observed or analyzed in an electron microscope while reducing evaporation of water in the liquid specimen S and preventing the liquid specimen S from dehydration and freezing.

Furthermore, with the method according to the second embodiment, the liquid specimen S can be observed or analyzed in a state where the liquid specimen S is housed in the space 3 formed by the specimen stage 20 and the lid member 2. Accordingly, for example, the hassle of removing the lid member 2 is eliminated and the time until observation or analysis is performed can be reduced. As described above, with the method according to the second embodiment, the liquid specimen S can be readily observed or analyzed. In addition, since evaporation of water in the liquid specimen S can be reduced even when an observation or an analysis is being performed, a prolonged observation or an analysis can be performed.

For example, the electron microscope 100 according to the first embodiment has the following features.

The electron microscope 100 includes the specimen stage 20 and the supporting member 30 for supporting the water retaining material 4, the lid member 2 is formed by having the supporting member 30 support the water retaining material 4, the liquid specimen S is housed in the space 3 formed by the lid member 2 and the specimen stage 20, and the water retaining material 4 is provided with the through-hole 4a which enables passage of the electron beam EB with which the liquid specimen S is irradiated. Therefore, with the electron microscope 100, the liquid specimen S can be observed or analyzed while reducing evaporation of water in the liquid specimen S and preventing the liquid specimen S from dehydration and freezing.

In addition, with the electron microscope 100, the liquid specimen S can be observed or analyzed in a state where the liquid specimen S is housed in the space 3 formed by the specimen stage 20 and the lid member 2. Therefore, with the electron microscope 100, the liquid specimen S can be readily observed or analyzed.

4. Modifications

Next, modifications of the electron microscope 100 according to the first embodiment described above and modifications of the method according to the second embodiment described above will be described. The following description will focus on points that differ from the electron microscope 100 and the method according to the second embodiment described above, and descriptions of similar points will be omitted. In addition, hereinafter, members of the electron microscopes according to the respective modifications with similar functions to the components of the electron microscope 100 described above will be assigned same reference characters and detailed descriptions thereof will be omitted.

4.1. First Modification

Figure 7:
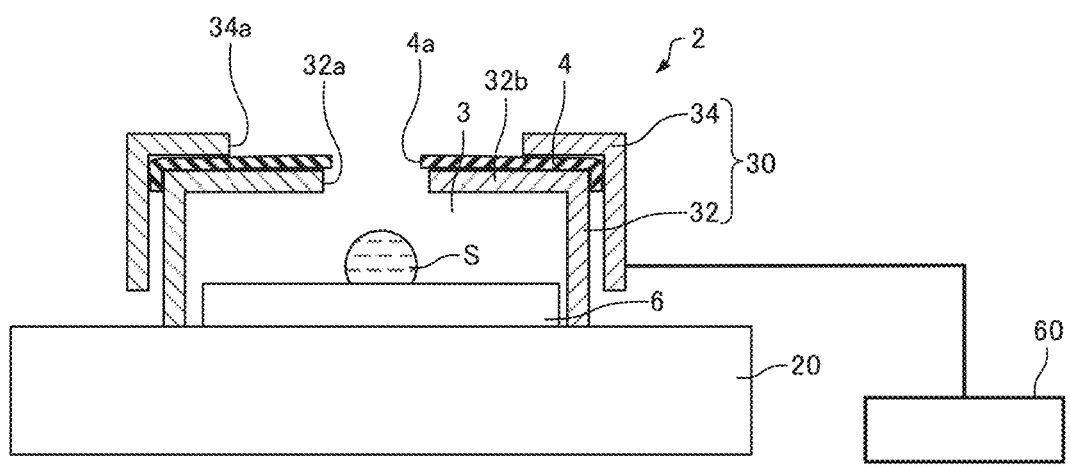
FIG. 7 is a sectional view schematically illustrating a lid member of an electron microscope according to a first modification.

FIG. 7 is a sectional view schematically illustrating the lid member 2 of an electron microscope according to a first modification. It should be noted that FIG. 7 corresponds to FIG. 2.

As illustrated in FIG. 7, the electron microscope according to the first modification includes a temperature controller 60 for heating or cooling the water retaining material 4.

The temperature controller 60 is thermally connected to the lid member 2 and heats or cools the lid member 2. In the example illustrated in FIG. 7, the temperature controller 60 is thermally connected to the supporting member 30 and the water retaining material 4 is heated or cooled by heating or cooling the supporting member 30. The temperature controller 60 heats or cools the lid member 2 by using a Peltier element, for example.

With a method according to the first modification, an amount of water vapor inside the space 3 is adjusted by adjusting the temperature of the water retaining material 4. Specifically, by controlling the temperature of the water retaining material 4 with the temperature controller 60, an amount of evaporation of water contained in the water retaining material 4 is adjusted to adjust an amount of water vapor supplied to the space 3. Therefore, with the method according to the first modification, the amount of water vapor in the space 3 can be set to a desired amount and the liquid specimen S can be observed or analyzed in a stable manner.

In addition, with the method according to the first modification, for example, since evaporation of water contained in the water retaining material 4 can be reduced by cooling the water retaining material 4, contamination of the specimen chamber, the electron detector 40, and the EDS detector 50 can be reduced.

4.2. Second Modification

Figure 8:
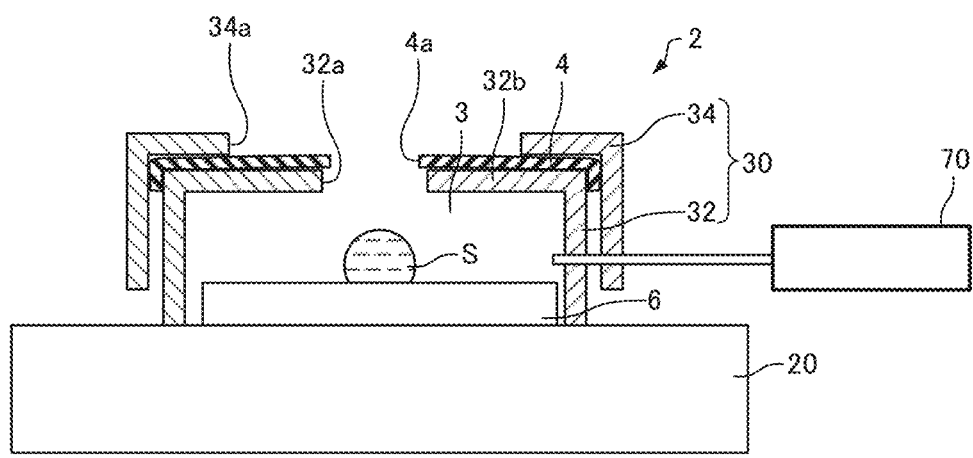
FIG. 8 is a sectional view schematically illustrating a lid member of an electron microscope according to a second modification.

FIG. 8 is a sectional view schematically illustrating the lid member 2 of an electron microscope according to a second modification. It should be noted that FIG. 8 corresponds to FIG. 2.

As illustrated in FIG. 8, the electron microscope according to the second modification includes a water vapor amount controller 70 for supplying water vapor to the space 3 formed by the specimen stage 20 and the lid member 2 or for removing water vapor from the space 3. Supplying water vapor to the space 3 or removing water vapor from the space 3 by using the water vapor amount controller 70 enables an amount of water vapor in the space 3 to be adjusted.

For example, the water vapor amount controller 70 is arranged outside of the space 3. The water vapor amount controller 70 supplies water vapor to the space 3 and removes water vapor from the space 3 via a pipe or the like that connects the space 3 and the water vapor amount controller 70 to each other. For example, the water vapor amount controller 70 is configured so as to include a dehumidification element. The dehumidification element is an element that performs dehumidification by utilizing a solid polymer electrolyte membrane, for example. Such a dehumidification element can also be used for humidification.

With the method according to the second modification, the amount of water vapor in the space 3 is adjusted by supplying water vapor to the space 3 or removing water vapor from the space 3. Therefore, with the method according to the second modification, the liquid specimen S can be stably observed or analyzed in a similar manner to the method according to the first modification.

4.3. Third Modification

Figure 9:
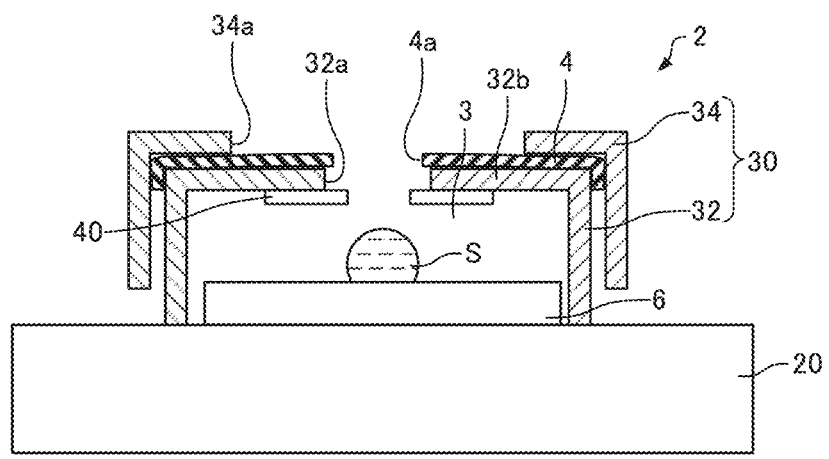
FIG. 9 is a sectional view schematically illustrating a lid member of an electron microscope according to a third modification.

FIG. 9 is a sectional view schematically illustrating the lid member 2 of an electron microscope according to a third modification. It should be noted that FIG. 9 corresponds to FIG. 2.

In the electron microscope according to the third modification, the electron detector 40 is provided on the supporting member 30 as illustrated in FIG. 9.

The electron detector 40 is provided so as to face the space 3. Therefore, for example, compared to a case where the electron detector 40 is provided outside the lid member 2 as illustrated in FIG. 1, a distance between the liquid specimen S and the electron detector 40 can be reduced. As a result, electrons emitted from the liquid specimen S can be efficiently detected by the electron detector 40. Furthermore, for example, compared to a case where the electron detector 40 is provided outside the lid member 2 as illustrated in FIG. 1, a working distance can be reduced.

4.4. Fourth Modification

Figure 10:
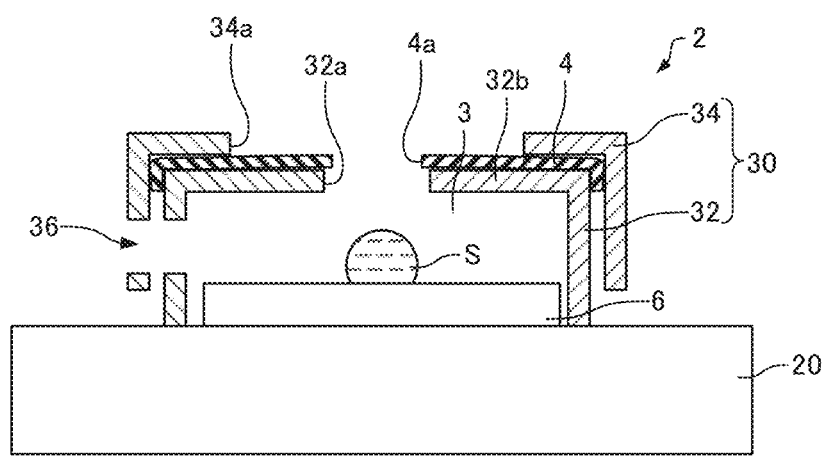
FIG. 10 is a sectional view schematically illustrating a lid member of an electron microscope according to a fourth modification.

FIG. 10 is a sectional view schematically illustrating the lid member 2 of an electron microscope according to a fourth modification. It should be noted that FIG. 10 corresponds to FIG. 2.

In the electron microscope according to the fourth modification, the supporting member 30 is provided with a through-hole 36 as illustrated in FIG. 10. With the electron microscope according to the third modification, the liquid specimen S can be observed with an optical camera or the like through the through-hole 36. In addition, a signal (for example, characteristic X-rays) from the liquid specimen S can be detected by a detector (for example, the EDS detector 50) through the through-hole 36.

While the through-hole 36 is provided on a side surface of the supporting member 30 in the example illustrated in FIG. 10, although not illustrated, the through-hole 36 may be provided on an upper surface of the supporting member 30.

In addition, while the supporting member 30 is provided with one through-hole 36 in the example illustrated in FIG. 10, although not illustrated, the supporting member 30 may be provided with a plurality of through-holes 36.

4.5. Fifth Modification

While cases where the water retaining material 4 of the electron microscope 100 described above is provided with the through-hole 4a that allows passage of the electron beam EB as illustrated in FIGS. 2 to 4 have been described, although not illustrated, a through-hole that allows passage of the electron beam EB may be provided in the lid member 2. Specifically, a through-hole that allows passage of the electron beam EB may be provided in the supporting member 30 instead of the water retaining material 4. Even in this case, the liquid specimen S can be readily observed or analyzed while preventing the liquid specimen S from dehydration and freezing in a similar manner to the example of the electron microscope 100.

The above-described embodiments and modifications are examples and the invention is not limited thereto. For example, the embodiments and the modifications may be combined appropriately.

The invention includes configurations that are substantially the same (for example, in function, method, and results, or in objective and effects) as the configurations described in the embodiments. The invention also includes configurations in which non-essential elements described in the embodiments are replaced by other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

Some embodiments of the invention have been described in detail above, but a person skilled in the art will readily appreciate that various modifications can be made from the embodiments without materially departing from the novel teachings and effects of the invention. Accordingly, all such modifications are assumed to be included in the scope of the invention.

The invention claimed is:

1. A method of observing a liquid specimen in an electron microscope, the method comprising:
   placing the liquid specimen on a specimen stage such that the liquid specimen is supported by the specimen stage;
   arranging a lid member on the specimen stage, thereby housing the liquid specimen in a space formed by a specimen stage and a lid member; and
   observing the liquid specimen,
   wherein the lid member comprises a water retaining material that retains water and a supporting member for supporting the water retaining material, water vapor created by vaporization of the water in the water retaining material is supplied into the space formed by the specimen stage and the lid member; and the lid member is provided with a through-hole configured to enable passage of an electron beam with which the liquid specimen is irradiated.

2. The method according to claim 1, further comprising:
adjusting an amount of water vapor in the space.

3. The method according to claim 2, wherein
the step of adjusting the amount of water vapor in the space is performed by supplying water vapor to the space or removing water vapor from the space.

4. The method according to claim 2, wherein
the step of adjusting the amount of water vapor in the space is performed by adjusting the temperature of the water retaining material.

5. The method according to claim 1, wherein
the step of observing the liquid specimen is performed through a through-hole provided in the supporting member.

6. The method according to claim 1, further comprising:
detecting a signal from the liquid specimen by using a detector provided on the supporting member.

7. The method according to claim 1, further comprising:
providing the water retaining material with a through-hole that enables passage of an electron beam with which the liquid specimen is irradiated.

8. The method according to claim 1, further comprising:
obtaining the water retaining material by causing paper, cloth, non-woven fabric, sponge, or a water absorptive polymer to contain water.

9. A method of analyzing a liquid specimen in an electron microscope, the method comprising:
placing the liquid specimen on a specimen stage such that the liquid specimen is supported by the specimen stage;
arranging a lid member on the specimen stage, thereby housing the liquid specimen in a space formed by a specimen stage and a lid member; and
analyzing the liquid specimen,
wherein the lid member comprises a water retaining material that retains water and a supporting member for supporting the water retaining material,
water vapor created by vaporization of the water in the water retaining material is supplied into the space formed by the specimen stage and the lid member; and
the lid member is provided with a through-hole that enables passage of an electron beam with which the liquid specimen is irradiated.

10. The method according to claim 9, further comprising:
adjusting an amount of water vapor in the space.

11. The method according to claim 10, wherein
the step of adjusting the amount of water vapor in the space is performed by supplying water vapor to the space or removing water vapor from the space.

12. The method according to claim 10, wherein
the step of adjusting the amount of water vapor in the space is performed by adjusting the temperature of the water retaining material.

13. The method according to claim 9, further comprising:
detecting, through a through-hole provided in the supporting member, a signal from the liquid specimen.

14. The method according to claim 9, further comprising:
detecting a signal from the liquid specimen by using a detector provided on the supporting member.

15. The method according to claim 9, further comprising:
providing the water retaining material with a through-hole that enables passage of an electron beam with which the liquid specimen is irradiated.

16. An electron microscope for observing or analyzing a liquid specimen, the electron microscope comprising:
a specimen stage having the liquid specimen placed thereon and configured to support the liquid specimen; and
a lid member comprising a supporting member and a water retaining material supported by the supporting member, the water retaining material retains water,
wherein the lid member is arranged on the specimen stage such that the liquid specimen is housed in a space formed by the lid member and the specimen stage,
water vapor created by vaporization of the water in the water retaining material is supplied into the space formed by the specimen stage and the lid member, and
the lid member is provided with a through-hole that enables passage of an electron beam with which the liquid specimen is irradiated.

17. The electron microscope according to claim 16, further comprising:
a dehumidification element utilizing a solid polymer electrolyte membrane to supply water vapor to the space or remove water vapor from the space via a pipe that connects the space with the dehumidification element.

18. The electron microscope according to claim 16, further comprising:
a Peliter element thermally connected to the lid member that heats or cools the water retaining material.

19. The electron microscope according to claim 16, further comprising:
a detector that is provided on the supporting member and detects a signal from the liquid specimen.

20. The electron microscope according to claim 16, wherein
the water retaining material is provided with a through-hole that enables passage of an electron beam with which the liquid specimen is irradiated.

* * * * *

UNITED STATES PATENT AND TRADEMARK OFFICE
CERTIFICATE OF CORRECTION

| | |
|---|---|
| PATENT NO. | : 10,741,357 B2 |
| APPLICATION NO. | : 16/362924 |
| DATED | : August 11, 2020 |
| INVENTOR(S) | : Noriyuki Inoue et al. |

It is certified that error appears in the above-identified patent and that said Letters Patent is hereby corrected as shown below:

In the Claims

Column 12, Line 43, Claim 18, delete "Peliter" and insert -- Peltier --

Signed and Sealed this
Nineteenth Day of January, 2021

Andrei Iancu
*Director of the United States Patent and Trademark Office*